US011864334B2

(12) United States Patent
Lee et al.

(10) Patent No.: US 11,864,334 B2
(45) Date of Patent: Jan. 2, 2024

(54) DISPLAY DEVICE

(71) Applicant: LG Display Co., Ltd., Seoul (KR)

(72) Inventors: SeungHee Lee, Goyang-si (KR); MiJin Han, Gimpo-si (KR); Hyosung Lee, Gwangmyeong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/558,331

(22) Filed: Dec. 21, 2021

(65) Prior Publication Data

US 2022/0210935 A1 Jun. 30, 2022

(30) Foreign Application Priority Data

Dec. 29, 2020 (KR) ........................ 10-2020-0186851

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01)

(58) Field of Classification Search
CPC ...... H05K 5/0217; G06F 1/1652; G09F 9/301
See application file for complete search history.

(56) References Cited

U.S. PATENT DOCUMENTS

| 10,420,227 | B2 * | 9/2019 | Lee ...................... | H05K 5/0221 |
| 10,613,588 | B2 * | 4/2020 | Chang .................. | G06F 1/1652 |
| 2015/0340004 | A1 * | 11/2015 | Pang .................... | G06F 1/1652 |
| | | | | 345/205 |
| 2016/0029474 | A1 * | 1/2016 | Cho ..................... | H05K 5/0017 |
| | | | | 361/749 |
| 2017/0023978 | A1 | 1/2017 | Cho et al. | |
| 2017/0325343 | A1 * | 11/2017 | Seo ..................... | H05K 5/03 |
| 2017/0373269 | A1 * | 12/2017 | Seo ..................... | H10K 50/84 |
| 2018/0070466 | A1 * | 3/2018 | Kim .................... | H04N 5/655 |
| 2018/0103551 | A1 * | 4/2018 | Park .................... | H05K 5/0217 |
| 2018/0376603 | A1 * | 12/2018 | Lee ..................... | H05K 5/0221 |
| 2019/0064881 | A1 * | 2/2019 | Kim .................... | G06F 1/1652 |
| 2019/0198783 | A1 * | 6/2019 | Kim .................... | H10K 59/12 |
| 2019/0301242 | A1 * | 10/2019 | Shipman ................ | E06B 9/78 |
| 2019/0319416 | A1 * | 10/2019 | Zhang .................. | H05K 5/0069 |
| 2019/0324502 | A1 * | 10/2019 | Chang .................. | G06F 1/1652 |
| 2019/0371214 | A1 * | 12/2019 | Kim ..................... | G09F 11/02 |
| 2020/0013317 | A1 * | 1/2020 | Cho ..................... | H05K 5/0217 |

(Continued)

FOREIGN PATENT DOCUMENTS

| EP | 3 121 680 A1 | 1/2017 |
| EP | 3 333 666 A1 | 6/2018 |

(Continued)

*Primary Examiner* — Sagar Shrestha
(74) *Attorney, Agent, or Firm* — Seed IP Law Group LLP

(57) ABSTRACT

A display device includes a display assembly including a display panel and a back cover configured to support a rear surface of the display panel, a roller configured to wind or unwind the display assembly, a drive assembly configured to move the roller in an amount corresponding to a winding amount or an unwinding amount of the display assembly about the roller, and a housing configured to accommodate the display assembly, the roller and the drive assembly, the housing having an opening through which the display assembly moves in and out of the housing in response to rotation of the roller.

19 Claims, 12 Drawing Sheets

(56) References Cited

U.S. PATENT DOCUMENTS

| | | | |
|---|---|---|---|
| 2022/0189351 A1* | 6/2022 | Choi | G06F 1/1652 |
| 2023/0199981 A1* | 6/2023 | Pyo | H02K 11/20 |
| | | | 361/807 |

FOREIGN PATENT DOCUMENTS

| | | |
|---|---|---|
| JP | H05-165104 A | 6/1993 |
| JP | 2000-347579 A | 12/2000 |
| JP | 2002-238211 A | 8/2002 |
| JP | 2003-50392 A | 2/2003 |
| JP | 2006-507543 A | 3/2006 |
| JP | 2016-505877 A | 2/2016 |
| JP | 2019-530018 A | 10/2019 |
| JP | 2020-8856 A | 1/2020 |
| KR | 10-1492050 B1 | 2/2015 |
| KR | 10-1945985 B1 | 2/2019 |
| KR | 10-2020-0053354 A | 5/2020 |
| TW | I667568 B | 8/2019 |
| TW | 202020515 A | 6/2020 |
| TW | 202030705 A | 8/2020 |

\* cited by examiner

DISPLAY DEVICE

CROSS-REFERENCE TO RELATED APPLICATIONS

This application claims the priority of Korean Patent Application No. 10-2020-0186851 filed on Dec. 29, 2020, in the Korean Intellectual Property Office, the entire disclosure of which is incorporated herein by reference.

BACKGROUND

Technical Field

The present disclosure relates to a display device, and more particularly, to a rollable display device which may display an image even when rolled up.

Description of the Related Art

Display devices employed by the monitor of a computer, a TV, a mobile phone or the like include an organic light emitting display (OLED) that emits light by itself, and a liquid crystal display (LCD) that requires a separate light source.

As display devices have been increasingly applied to diverse fields such as a computer monitor, a TV, and a personal mobile device, display devices having a large display area and a reduced volume and weight have been studied.

Further, recently, a rollable display device has attracted attention as a next-generation display device.

BRIEF SUMMARY

A display device according to the present disclosure is capable of solving a problem that may be caused by a change in position of a display part when the display part is wound or unwound.

A display device according to the present disclosure may also be capable of suppressing shielding of a display area or the occurrence of scratches on a surface of a display panel that may occur when an auxiliary roller is used to solve a change in position of a display part.

In an embodiment, a display device includes: a display part including a display panel and a back cover configured to support a rear surface of the display panel; a roller configured to wind or unwind the display part; a moving unit configured to move the roller so as to correspond to a winding or unwinding amount of the display part; and a housing part configured to accommodate the roller and the moving unit and having an opening so that the display part moves to an outside.

In an embodiment, a display part is wound or unwound, and even when the total thickness of the display part wound on a roller changes, the roller can be moved without using an auxiliary roller. Thus, the display part can be maintained at a constant position.

In an embodiment, a change in position of the display part can be solved without using an auxiliary roller that may shield a display area or cause the occurrence of scratches on a surface of a display panel.

In an embodiment, the display device is a flexible display device with a display part, lines, etc., formed on a flexible substrate made of flexible plastic and which may display an image even when rolled up.

The benefits and advantages of the present disclosure are not limited to the contents exemplified above, and more various benefits and advantages are included in the present specification. Embodiments of the present disclosure are not limited to the above-mentioned embodiments, and other embodiments, which are not mentioned above, are contemplated herein and can be clearly understood by those skilled in the art from the following description. Other detailed matters of the embodiments of the disclosure are included in the following detailed description and the enclosed drawings.

BRIEF DESCRIPTION OF THE SEVERAL VIEWS OF THE DRAWINGS

The above and other aspects, features and advantages of the present disclosure will be more clearly understood from the following detailed description taken in conjunction with the accompanying drawings, in which.

DETAILED DESCRIPTION

Figure 1A:
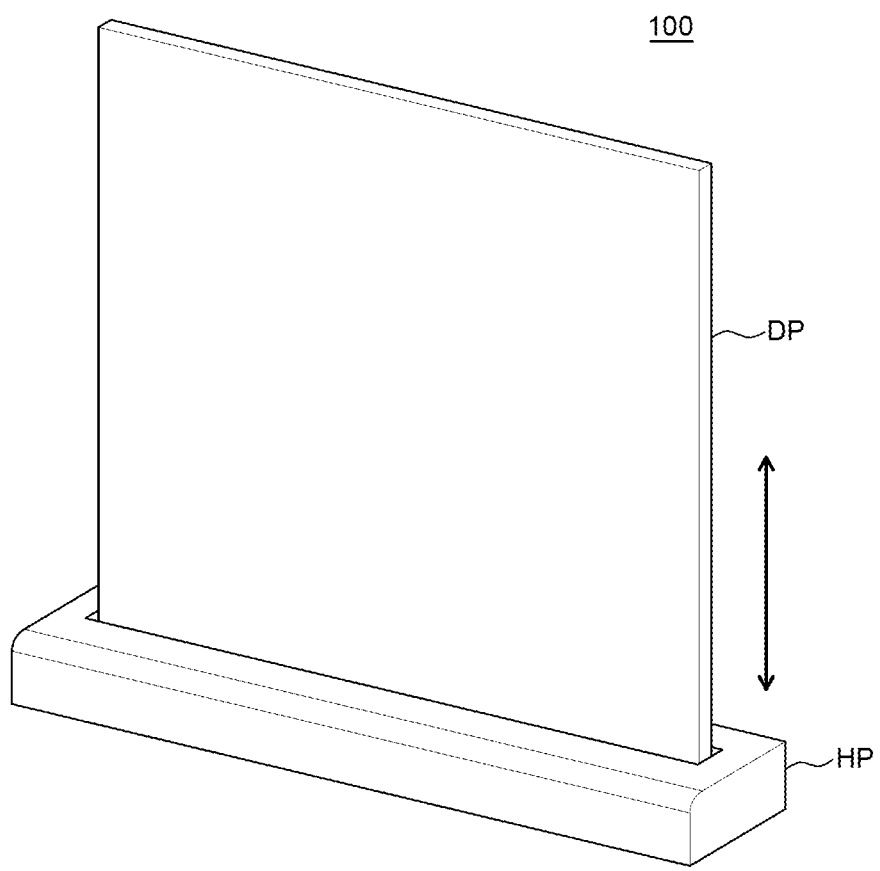
FIG. 1A and FIG. 1B are perspective views of a display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

Display Device-Rollable Display Device

A rollable display device may refer to a display device which may display an image even when rolled up. The rollable display device may have higher flexibility than conventional typical display devices. The rollable display device may be freely changed in shape depending on whether the rollable display device is in use or not. Specifically, when the rollable display device is not in use, the rollable display device may be accommodated in a rolled up configuration to reduce its volume. In contrast, when the rollable display device is used, the rolled display device may be unrolled.

Figure 1B:
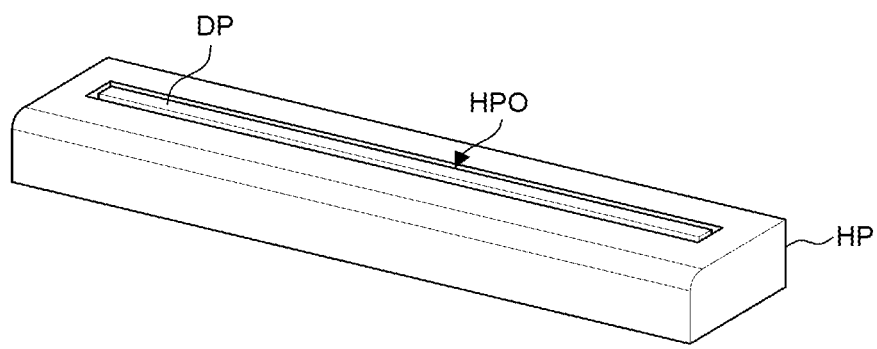
Figure 2:
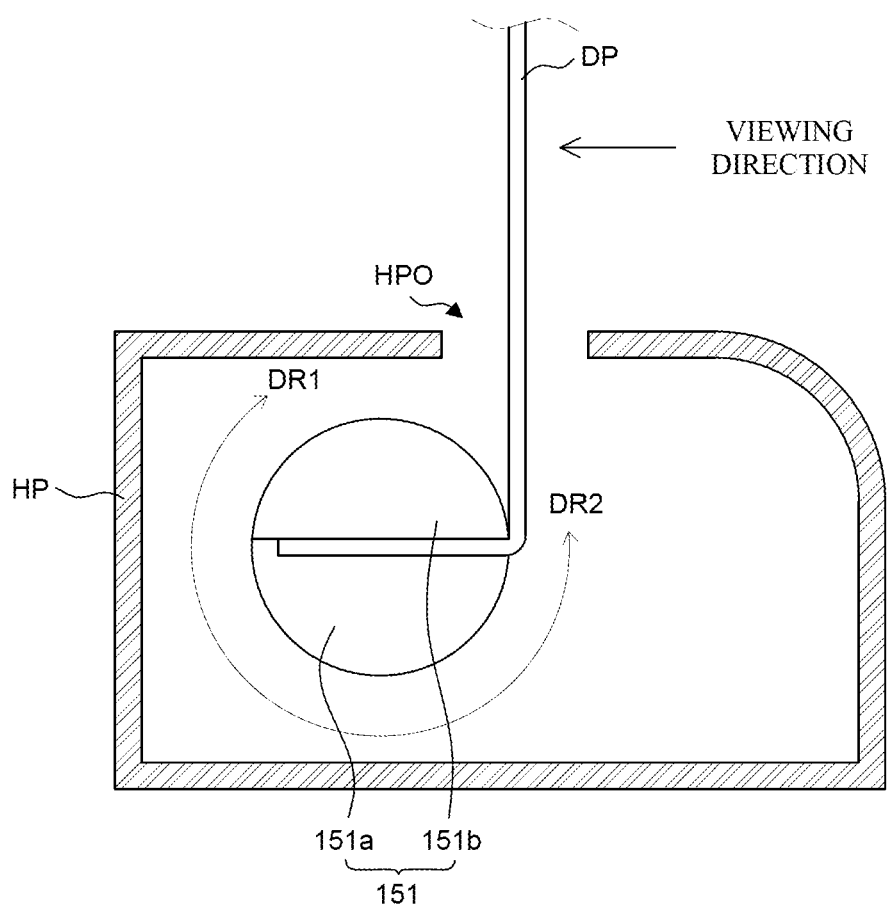
FIG. 2 is a cross-sectional view of the display device of FIG. 1A according to an embodiment of the present disclosure.

FIG. 1A and FIG. 1B are perspective views of a display device 100 according to an embodiment of the present disclosure. FIG. 2 is a cross-sectional view of the display device 100 according to an embodiment of the present disclosure.

First, referring to FIG. 1A and FIG. 1B, the display device 100 according to an embodiment of the present disclosure includes a display part DP (which may also be referred to herein as a display DP or a display assembly DP) and a housing part HP (which may also be referred to herein as a housing HP).

The display part DP is configured to display images to a user. For example, display elements, circuits for driving the display elements, lines, and other components may be disposed in the display part DP. Herein, the display device 100 according to an embodiment of the present disclosure is a rollable display device 100. Therefore, the display part DP may be configured to be wound and unwound. For example, the display part DP may include a display panel and a back cover which are flexible so as to be wound or unwound. More details of the display part DP will be described later with reference to FIG. 3 and FIG. 4.

The housing part HP serves as a case where the display part DP may be accommodated. The display part DP may be wound and then accommodated inside the housing part HP in a rolled or wound configuration, and the display part DP may be unwound and then disposed outside the housing part HP in an unrolled or unwound configuration.

The housing part HP includes an opening HPO through which the display part DP may move in and out of the housing part HP. The display part DP may move up and down through the opening HPO of the housing part HP.

Meanwhile, the display part DP of the display device 100 may transition from a fully unwound state to a fully wound state, or vice versa.

FIG. 1A shows a fully unwound state of the display part DP of the display device 100. The fully unwound state refers to a state where the display part DP of the display device 100 is disposed outside the housing part HP. That is, the fully unwound state may be defined as a state where the display part DP is unwound a maximum amount and cannot be further unwound with the display part DP disposed outside the housing part HP in order for the user to watch images on the display device 100.

FIG. 1B shows a fully wound state of the display part DP of the display device 100. The fully wound state refers to a state where the display part DP of the display device 100 is accommodated inside the housing part HP and may not be further wound. That is, the fully wound state may be defined as a state where the display part DP is wound and completely accommodated or received inside the housing part HP when the user does not watch images on the display device 100 or when the display part DP is not in use. In the fully wound state, the display part DP is preferably accommodated inside the housing part HP to improve the external appearance of the display device 100. Further, in the fully wound state where the display part DP is accommodated inside the housing part HP, the display device 100 is reduced in volume and easy to transport.

Referring to FIG. 2, the display part DP may be manipulated between the fully unwound state and the fully wound state by a roller 151 of a driving part MP (which may also be referred to herein as a drive MP or a drive assembly MP) to be described later. For the convenience of description, FIG. 2 illustrates only the housing part HP, the display part DP and the roller 151.

The roller 151 is a member on which the display part DP is wound. Specifically, the roller 151 rotates clockwise or counterclockwise to wind or unwind the display part DP fixed to the roller 151 in combination with the driving part MP. A lower or bottom edge of the display part DP may be fixed to the roller 151. When the roller 151 rotates, the display part DP whose lower edge is fixed to the roller 151 may be wound on the roller 151. On the contrary, when the roller 151 rotates in the opposite direction, the display part DP wound on the roller 151 may be unwound from the roller 151.

Specifically, when the display part DP is wound, the roller 151 may rotate and the display part DP may be wound on the roller 151. When the roller 151 rotates in a first direction DR1, i.e., in a clockwise direction, a front surface of the display part DP which is in a viewing direction of the display part DP is in close contact with a surface of the roller 151 to thereby be wound. When the display part DP is unwound, the roller 151 may rotate and the display part DP may be unwound from the roller 151. When the roller 151 rotates in a second direction DR2, i.e., in a counterclockwise direction, the display part DP wound on the roller 151 is unwound from the roller 151 and may be disposed outside the housing part HP.

The roller 151 may include a base portion 151a and a top cover 151b. The base portion 151a and the top cover 151b may be a single, integral, unitary structure, or may be separate and distinct structures coupled to each other. The lower edge of the display part DP is fixed between the base portion 151a and the top cover 151b and engaged with the roller 151. The roller 151 may have a cylindrical shape. That is, the roller 151 has a cylindrical shape in a state in which the base portion 151a, the top cover 151b and the display part DP are fixed to one another. However, the roller 151 may have any shape allowing for winding of the display part DP, and is not limited to the above examples.

In some embodiments, a spring may be disposed on at least one side of the roller 151 and may apply force in a winding direction of the roller 151 using elastic force of the spring. Thus, the spring may apply elastic force to the display part DP in the fully unwound state so as to maintain a flat state of the display part DP or make it easier to wind the display part DP.

Display Part

Figure 3:
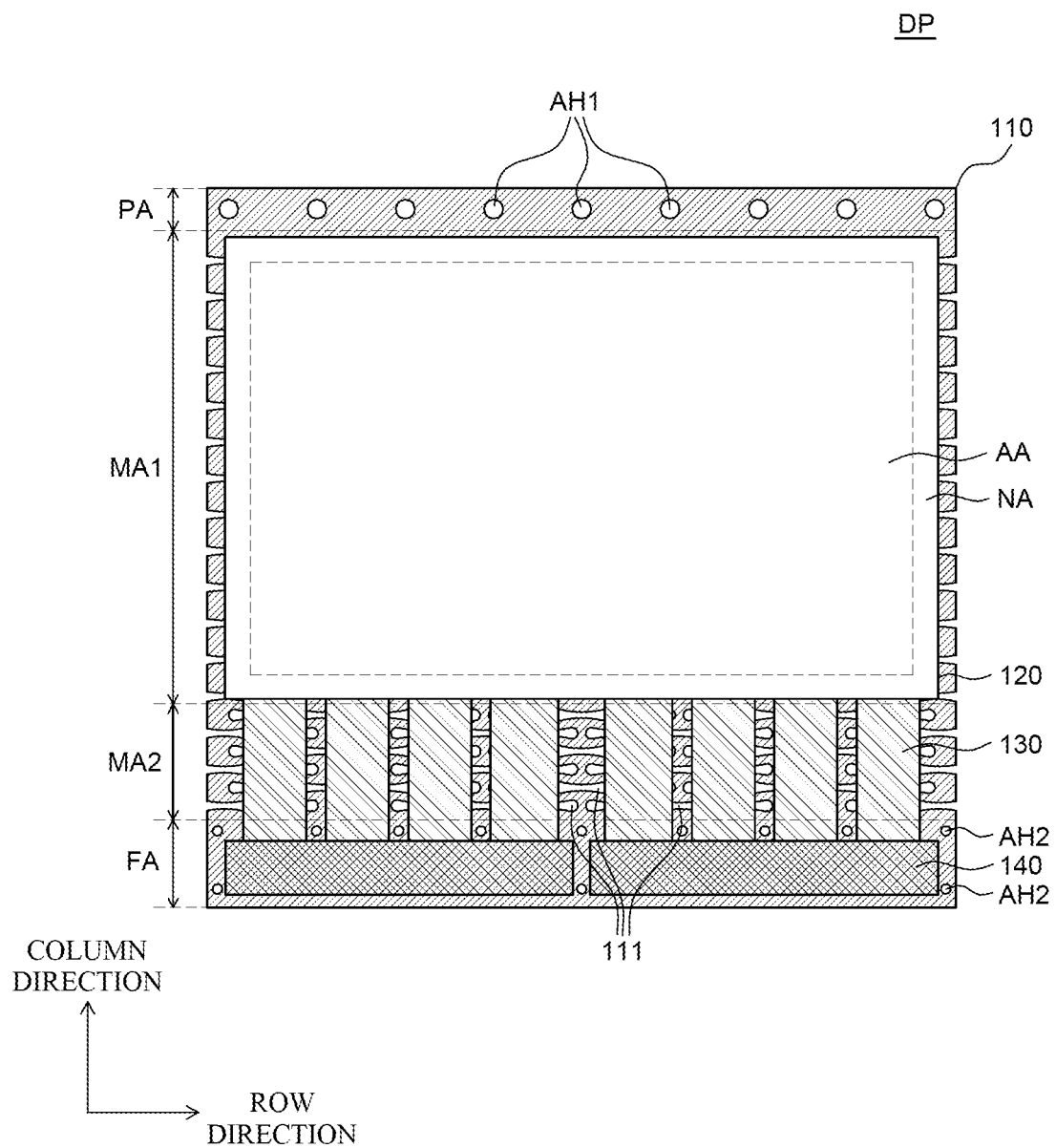
FIG. 3 is an elevational view of a display part of the display device of FIG. 1A according to an embodiment of the present disclosure.

FIG. 3 is an elevational view of the display part DP of the display device according to an embodiment of the present disclosure. Referring to FIG. 3, the display part DP of the display device 100 includes a back cover 110, a display panel 120, a flexible film 130 and a printed circuit board 140.

The back cover 110 is disposed on rear surfaces of the display panel 120, the flexible film 130, and the printed circuit board 140 and supports the display panel 120, the flexible film 130, and the printed circuit board 140. Thus, the back cover 110 may be larger in size than the display panel 120. That is, an outer edge of the back cover 110 may extend beyond, and be disposed further outward than an outer edge of the display panel 120 corresponding thereto. Accordingly, when the display part DP is disposed outside the housing part HP, the back cover 110 may protect other components of the display part DP, in particular, the display panel 120, from external impacts.

The back cover 110 may be made of a rigid material, but at least a portion of the back cover 110 may be flexible to be wound or unwound along with the display panel 120. For example, the back cover 110 may be made of a metallic material such as Steel Use Stainless (SUS) or Invar, or plastic, but is not limited thereto. The material of the back cover 110 may vary depending on design factors, such as the amount of thermal deformation, a radius of curvature, rigidity, and the like.

The back cover 110 includes a fixed area FA, a support area PA, and a malleable area MA. Specifically, the back cover 110 includes a support area PA in an uppermost portion thereof, a fixed area FA in a lowermost portion thereof, and a malleable area MA between the support area PA and the fixed area FA. The support area PA is an area in which a plurality of openings 111 are not disposed, and the support area PA is fastened with a head bar 161 to be described later. The malleable area MA is an area in which the plurality of openings 111 are disposed on and on which winding or unwinding is substantially performed. The fixed area FA is an area for coupling the back cover 110, the printed circuit boards 140, and the flexible film 130 to the roller 151.

Figure 5:
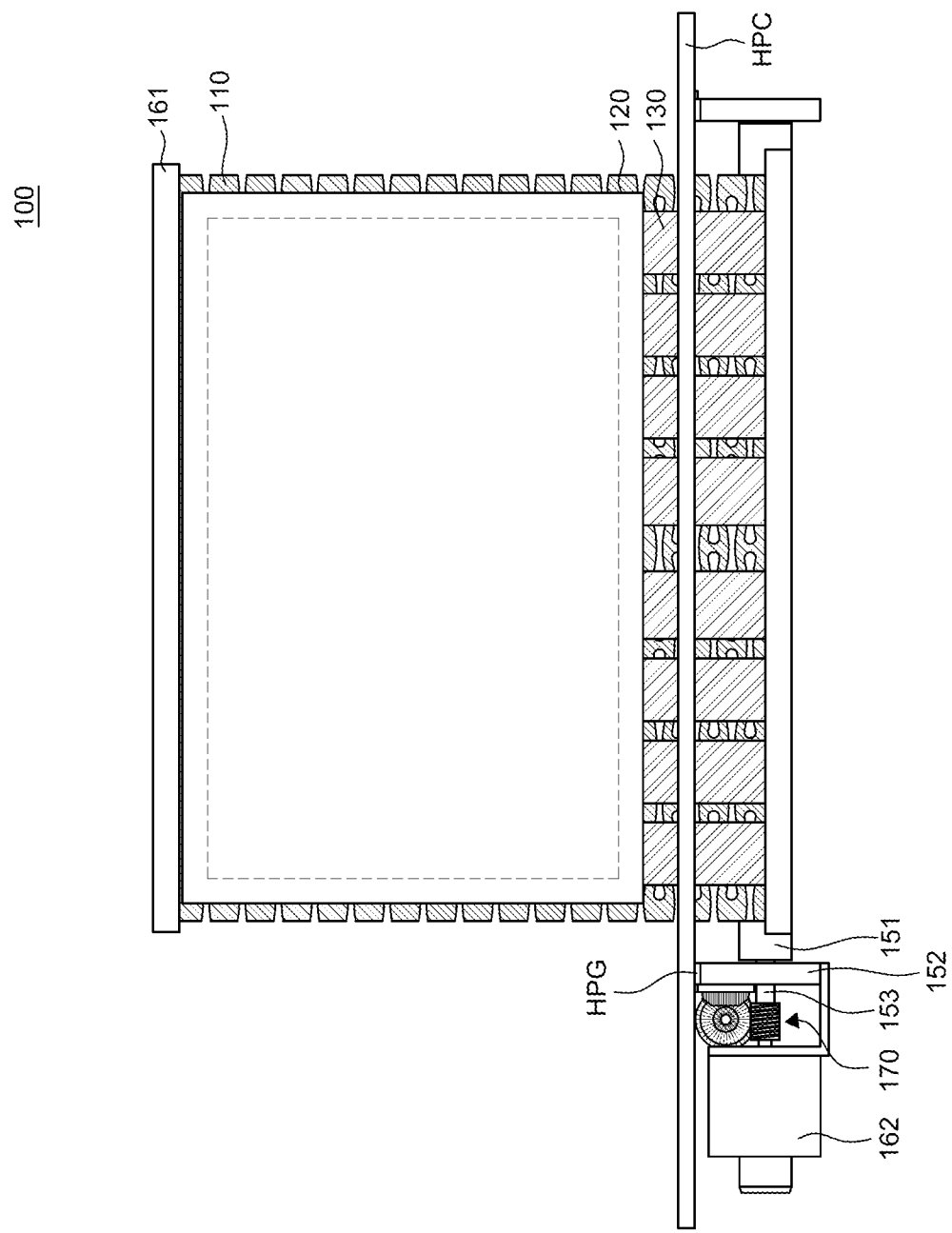
FIG. 5 is an elevational view of the display device of FIG. 1A according to an embodiment of the present disclosure.

The support area PA of the back cover 110 is an uppermost area of the back cover 110 and is fastened with the head bar 161 (FIG. 5). The support area PA includes first fastening holes AH1 so as to be fastened with the head bar 161. Further, screws that pass through the head bar 161 and the first fastening holes AH1 are disposed to fasten the head bar 161 and the support area PA of the back cover 110. As the support area PA is fastened with the head bar 161, when a lifting unit 160 (which may also be referred to herein as a lifting assembly 160) fastened to the head bar 161 ascends or descends, the back cover 110 may also ascend or descend together with the display panel 120 attached to the back cover 110. Although nine first fastening holes AH1 are illustrated in FIG. 3, the number of first fastening holes AH1 is not limited thereto and may include more or less than nine first fastening holes AH1. Further, although FIG. 3 illustrates that the back cover 110 is fastened with the head bar 161 using the first fastening holes AH1, the present disclosure is not limited thereto. The back cover 110 and the head bar 161 may be fastened with each other without a separate fastening hole.

The fixed area FA of the back cover 110 is a lowermost area of the back cover 110 and is fastened with the roller 151. The fixed area FA includes second fastening holes AH2 so as to be fastened with the roller 151. For example, screws that pass through the roller 151 and the second fastening holes AH2 are disposed to fasten the roller 151 and the fixed area FA of the back cover 110. Further, as the fixed area FA is fastened with the roller 151, the back cover 110 may be wound on or unwound from the roller 151 by rotation of the roller 151. Meanwhile, the number of a plurality of the second fastening holes AH2 illustrated in FIG. 3 is a non-limiting example, and the number of the plurality of second fastening holes AH2 may be selected based on the number of the printed circuit boards 140, the number of the flexible film 130, and the like.

The printed circuit board 140 and the flexible film 130 connected to one end, or a bottom end, of the display panel 120 are disposed in the fixed area FA of the back cover 110 and may be fixed thereto. A portion of the second fastening holes AH2 may be disposed between the respective flexible films 130, so that the flexible films 130 may be more stably fixed. The fixed area FA may allow the flexible film 130 and the printed circuit board 140 to be fastened to the roller 151 in a flat form rather than a curved form, in order to protect the flexible film 130 and the printed circuit board 140.

The malleable area MA of the back cover 110 is an area which is wound on or unwound from the roller 151, together with the display panel 120. The malleable area MA may overlap a portion of the display panel 120 and the flexible film 130.

The plurality of openings 111 are disposed in the malleable area MA of the back cover 110. When the display part DP is wound or unwound, the plurality of openings 111 may be deformed by a stress which is applied to the display part DP. Specifically, when the display part DP is wound or unwound, the malleable area MA of the back cover 110 may be deformed as the plurality of openings 111 are contracted or expanded. Further, as the plurality of openings 111 are contracted or expanded, a slip phenomenon of the display panel 120 disposed on the malleable area MA of the back cover 110 is minimized. Thus, the stress applied to the display panel 120 may be minimized.

Meanwhile, the plurality of openings 111 in the malleable area MA of the back cover 110 may not be formed in the support area PA and the fixed area FA of the back cover 110. That is, in the support area PA and the fixed area FA, only the first fastening holes AH1 and the second fastening holes AH2 are formed, but not the plurality of openings 111, in some embodiments. Further, the first fastening holes AH1 and the second fastening holes AH2 are different in shape from the plurality of openings 111. The support area PA and the fixed area FA respectively fixed to the head bar 161 and the roller 151 are preferably more rigid than the malleable area MA. Specifically, as the support area PA and the fixed area FA have rigidity, the support area PA and the fixed area FA may be firmly fixed to the head bar 161 and the roller 151, respectively. Therefore, the display part DP is fixed to the roller 151 and the head bar 161 of the driving part MP, thereby moving into or out of the housing part HP according to an operation of the driving part MP.

In the display device 100 according to an embodiment of the present disclosure, the back cover 110 provided with the plurality of openings 111 are disposed on the rear surface of the display panel 120 to support and protect the display panel 120. The back cover 110 is made of a metallic material or the like to have rigidity. Also, the plurality of openings 111 are formed in the malleable area MA of the back cover 110 where the display panel 120 is disposed, and, thus, the flexibility of the back cover 110 may be enhanced. Therefore, in the fully unwound state in which the display part DP of the display device 100 is disposed outside the housing part HP, the back cover 110 having high rigidity may support the display panel 120 to spread in a flat manner. In contrast, in the fully wound state in which the display part DP of the display device 100 is accommodated in the housing part HP, the back cover 110 having high flexibility due to the plurality of openings 111, together with the display panel 120, may be wound on the roller 151 and accommodated in the housing part HP.

Referring to FIG. 3, the malleable area MA includes a first malleable area MA1 extending from the support area PA and a second malleable area MA2 between the first malleable area MA1 and the fixed area FA. As shown in FIG. 3, the first malleable area MA1 may generally correspond to an area of the display panel 120 and the second malleable area MA2 may extend from a bottom of the display panel 120 to the fixed area FA of the back cover 110 in one or more embodiments.

The first malleable area MA1 is an area in which the plurality of openings 111 are disposed and to which the display panel 120 is attached. The second malleable area MA2 is an area extended from the first malleable area MA1 to the fixed area FA. The plurality of openings 111 are disposed in the second malleable area MA2, but the display panel 120 is not disposed therein. Further, at least a portion of the flexible film 130 is disposed in the second malleable area MA2 with the flexible film extending from the display panel 120 to the printed circuit board 140.

The second malleable area MA2 is an area which extends so that a display area AA of the display panel 120 may be disposed outside the housing part HP. For example, when the back cover 110 and the display panel 120 are fully unwound, a region of the back cover 110 from the fixed area FA, which is coupled to the printed circuit board 140 and to the roller 151, to the second malleable area MA2, which is coupled to the flexible film 130, may be disposed inside the housing part HP. Thus, the support area PA and the first malleable area MA1, which is coupled to the display panel 120, may be disposed outside the housing part HP. Here, the length of the back cover 110 from the fixed area FA to the second malleable area MA2 may be smaller or less than the length of the back cover 110 from the fixed area FA to the opening HPO of the housing part HP. In this case, a portion of the first malleable area MA1 to which the display panel 120 is attached may be disposed inside the housing part HP. Therefore, since a portion of a lower end of the display area AA of the display panel 120 is disposed inside the housing part HP, it may be difficult to watch images. Therefore, the length from the fixed area FA to the second malleable area MA2 of the back cover 110 may be selected to be equal to the length from the fixed area FA of the back cover 110 to the opening HPO of the housing part HP.

The display panel 120 is configured to display images to the user. The display panel 120 may include display elements that display images, driving elements that drive the display elements, and lines that transmit various signals to the display elements and the driving elements.

The display element may be defined in different ways depending on a type of the display panel 120. For example, when the display panel 120 is an organic light emitting display panel, the display element may be an organic light emitting element which includes an anode, an organic light emitting layer, and a cathode. For example, when the display panel 120 is a liquid crystal display panel, the display element may be a liquid crystal display element. Further, when the display panel 120 is a light emitting display panel including LEDs, the display element may be an LED. Hereinafter, even though the display panel 120 is assumed as an organic light emitting display panel, the display panel 120 is not limited to the organic light emitting display panel. Further, since the display device 100 according to an embodiment of the present disclosure is a rollable display device, the display panel 120 may be implemented as a flexible display panel to be wound on or unwound from the roller 151.

Referring to FIG. 3, the display panel 120 includes the display area AA and a non-display area NA.

The display area AA is an area where images are displayed in the display panel 120. In the display area AA, a plurality of sub-pixels constituting a plurality of pixels and driving circuits for driving the plurality of sub-pixels may be disposed. The plurality of sub-pixels are minimum units which configure the display area AA, and the display element may be disposed in each of the plurality of sub-pixels. For example, an organic light emitting element which includes an anode, an organic light emitting layer, and a cathode may be disposed in each of the plurality of sub-pixels, but the present disclosure is not limited thereto. Further, the circuits for driving the plurality of sub-pixels may include driving elements, lines, and the like. For example, the circuit may be configured by a thin film transistor, a storage capacitor, a gate line, a data line, and the like, but is not limited thereto.

The non-display area NA is an area where no image is displayed. The non-display area NA surrounds an outer periphery of the display area AA. In the non-display area NA, various lines, circuits, and the like for driving the organic light emitting elements of the display area AA are disposed. For example, in the non-display area NA, a link line which transmits signals to the plurality of sub-pixels and circuits of the display area AA or a driver IC, such as a gate driver IC or a data driver IC, may be disposed, but the present disclosure is not limited thereto.

The flexible film 130 is a film in which various components are disposed on a base film having flexibility. Since the flexible film 130 is flexible, a portion of the flexible film 130, together with the second malleable area MA2, may be wound on or unwound from the roller 151. The flexible film 130 supplies signals to the plurality of sub-pixels and the circuits of the display area AA and is electrically connected to the display panel 120. The flexible film 130 is disposed on one end of the non-display area NA of the display panel 120 to supply a power voltage or a data voltage to the plurality of sub-pixels and the circuits of the display area AA. The number of flexible films 130 illustrated in FIG. 3 is one non-limiting example, and the number of flexible films 130 may be selected based on the design and is not limited to the number shown in FIG. 3.

Meanwhile, for example, a driver IC, such as a gate driver IC or a data driver IC, may also be disposed on the flexible film 130. The driver IC is a component which processes data for displaying images and a driving signal for processing the data. The driver IC may be disposed in a chip on glass (COG), a chip on film (COF), a tape carrier package (TCP) manner, or the like depending on a mounting method. For the convenience of description, it is described that the driver IC is mounted on the flexible film 130 in a chip on film manner, but the present disclosure is not limited thereto.

The printed circuit board 140 is disposed on one end or a bottom end of the flexible film 130 and is connected to the flexible film 130. The printed circuit board 140 is a component which supplies signals to the driver IC. The printed circuit board 140 supplies various signals, such as a driving signal or a data signal, to the driver IC. Various components may be disposed on the printed circuit board 140. For example, a timing controller, a power source unit, or the like may be disposed on the printed circuit board 140. Although two printed circuit boards 140 are illustrated in FIG. 3, the number of printed circuit boards 140 may vary depending on the design and is not limited thereto.

Meanwhile, although not illustrated in FIG. 3, the display part DP may include an additional printed circuit board connected to the printed circuit board 140. For example, the printed circuit board 140 may be referred to as a source printed circuit board (source PCB) S-PCB on which a data driver is mounted. The additional printed circuit board connected to the printed circuit board 140 may be referred to as a control printed circuit board (control PCB) C-PCB on which a timing controller or the like is mounted. The additional printed circuit board may be disposed inside the roller 151, or may be disposed outside the roller 151 within the housing part HP.

Coupling Structure of Display Part and Roller

Figure 4:
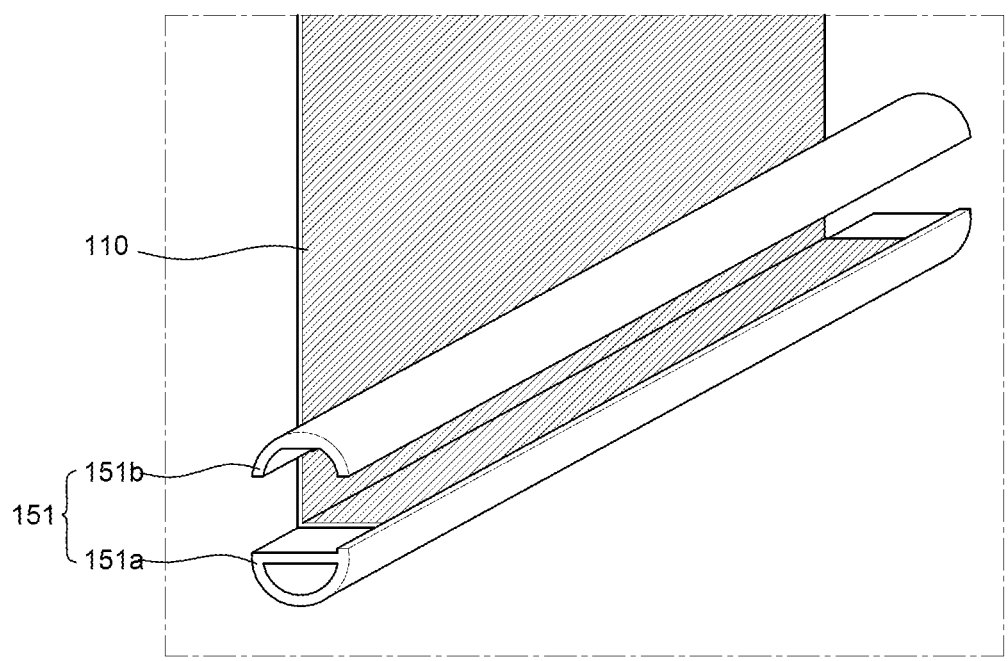
FIG. 4 is an exploded perspective view of a coupling structure of a roller and the display part of the display device of FIG. 1A according to an embodiment of the present disclosure.

FIG. 4 is an exploded perspective view of the roller 151 and the display part DP of the display device according to an embodiment of the present disclosure.

Referring to FIG. 4, the lower edge of the display part DP is fixed between the base portion 151a and the top cover 151b of the roller 151. Specifically, the fixed area FA of the back cover 110, a portion of the flexible film 130, and the printed circuit board 140 are disposed between the base portion 151a and the top cover 151b of the roller 151 in some embodiments. In one or more embodiments, only one of the above features is disposed between the base portion 151a and the top cover 151b of the roller 151, or any combination of the features may be disposed between the base portion 151a and the top cover 151b of the roller 151.

A portion of an outer circumferential surface of the base portion 151a is formed as a flat surface portion, and the other portion of the outer circumferential surface is formed as a curved surface portion. The flat surface portion of the base portion 151a may be a portion on which the fixed area FA of the display part DP, a portion of the flexible film 130, and the printed circuit board 140 are seated. The fixed area FA is fixed to the flat surface portion of the base portion 151a by the plurality of second fastening holes AH2.

The top cover 151b is fastened to the flat surface portion of the base portion 151a. More specifically, a screw passes through the top cover 151b of the roller 151, the fixed area FA of the back cover 110, and the base portion 151a of the roller 151. Thus, the roller 151 and the fixed area FA may be fastened with each other.

In this case, an upper surface of the top cover 151b may have a convex curved surface shape. Also, the curved surface shape of the top cover 151b may be a shape corresponding to the curved surface portion of the base portion 151a. Therefore, a cross-section of the roller 151 after the base portion 151a and the top cover 151b are coupled may have a substantially circular shape. Accordingly, after the fixed area FA, a portion of the flexible film 130, and the printed circuit board 140 are disposed on the flat surface portion of the base portion 151a, the malleable area MA of the back cover 110 and the display panel 120 may be wound along the outer circumferential surface of the roller 151 having a circular shape.

Meanwhile, the printed circuit board 140 disposed in the fixed area FA is disposed on the flat surface portion of the base portion 151a so as to maintain a flat state without being bent. Therefore, the printed circuit board 140 may always maintain a flat state regardless of whether the display part DP is wound or unwound. Also, it is possible to suppress damage to the printed circuit board 140 that may occur when the printed circuit board 140 is bent.

Driving Part

FIG. 5 is a plan view of the display device 100 according to an embodiment of the present disclosure. Here, for the convenience of description, FIG. 5 illustrates only a ceiling or top surface HPC of the housing part HP.

Referring to FIG. 5, the driving part MP includes a roller unit 150 (which may also be referred to herein as a roller rotation assembly 150 or a roller drive assembly 150), the lifting unit 160, and a moving unit 170 (which may also be referred to herein as a roller movement assembly 170).

The roller unit 150 rotates the roller 151 clockwise or counterclockwise to wind or unwind the display part DP fixed to the roller 151. The roller unit 150 is disposed inside the housing part HP illustrated in FIG. 1A through FIG. 2. The roller unit 150 includes the roller 151, a roller support unit 152 (which may also be referred to herein as a roller support 152 or a support 152), and a rotation shaft 153.

The lower edge of the display part DP may be fixed to the roller 151. Accordingly, when the roller 151 rotates clockwise or counterclockwise, the display part DP may be wound on or unwound from the roller 151.

The rotation shaft 153 is connected to a motor 162 and rotated by force applied from the motor 162. The rotation shaft 153 may be connected to the roller 151 and rotated together with the motor 162 by transmitting a rotary movement of the motor 162 to the roller 151. In some embodiments, the motor 162 is an electric rotary motor structured to rotate a drive shaft. The drive shaft may be the rotation shaft 153 or may be a separate component of the motor 162 coupled to the rotation shaft 153 and structured to apply a force to rotate the rotation shaft 153. Because the rotation shaft 153 is coupled to the roller 151, rotation of the rotation shaft 153 via the motor 162 results in rotation of the roller 151 as well.

The roller support unit 152 supports the roller 151 at both sides of the roller 151. For example, the roller support unit 152 may support the rotation shaft 153, which is coupled to the roller 151, to support the roller 151, but the present disclosure is not limited thereto. The roller support unit 152 may support the roller 151 directly in some embodiments. Here, the rotation shaft 153 may be rotatably coupled with the roller support unit 152.

The roller support unit 152 is connected to the ceiling or top surface HPC of the housing part HP. Thus, the roller support unit 152 may support the roller 151 spaced apart from the ceiling or top surface HPC of the housing part HP.

The lifting unit 160 moves the display part DP up and down according to driving of the roller unit 150. The lifting unit 160 includes the head bar 161 and the motor 162. Although not illustrated in FIG. 5, a link unit and a chain unit may be further included in the lifting unit 160. That is, the lifting unit 160 may further include a link unit and a chain unit connected to the head bar 161 and thus may move the display part DP in a vertical direction by lifting the head bar 161 via the motor 162 and the link or chain unit.

The head bar 161 covers only a part of a surface adjacent to the uppermost edge of the display part DP so as not to shield images displayed on the front surface of the display part DP. The display part DP and the head bar 161 may be fixed by screws or other fasteners, but the present disclosure is not limited thereto.

The motor 162 may be connected to a power generation unit or power supply, such as a separate external power supply or a built-in battery so as to be supplied with power from the power generation unit. The motor 162 generates rotatory power to supply driving force to the rotation shaft 153.

In some embodiments, the roller unit 150 and the lifting unit 160 each having a different structure from the above-described roller unit 150 and the lifting unit 160, respectively, may also be applied to the display device 100. That is, the roller unit 150 and the lifting unit 160 may be changed in configuration and structure to achieve winding and unwinding of the display part DP. In some embodiments, some of their components may be omitted or other components may be added.

The moving unit 170 is disposed inside the housing part HP shown in FIG. 1A through FIG. 2 and disposed at one end or a first end of the roller 151 so as to move the roller 151 in a horizontal direction during winding or unwinding of the roller 151. In FIG. 5, the first end of the roller 151 is the left end of the roller 151. The horizontal movement of the roller 151 by the moving unit 170 will be described in detail later with reference to FIG. 6A through FIG. 7B.

Figure 6A:
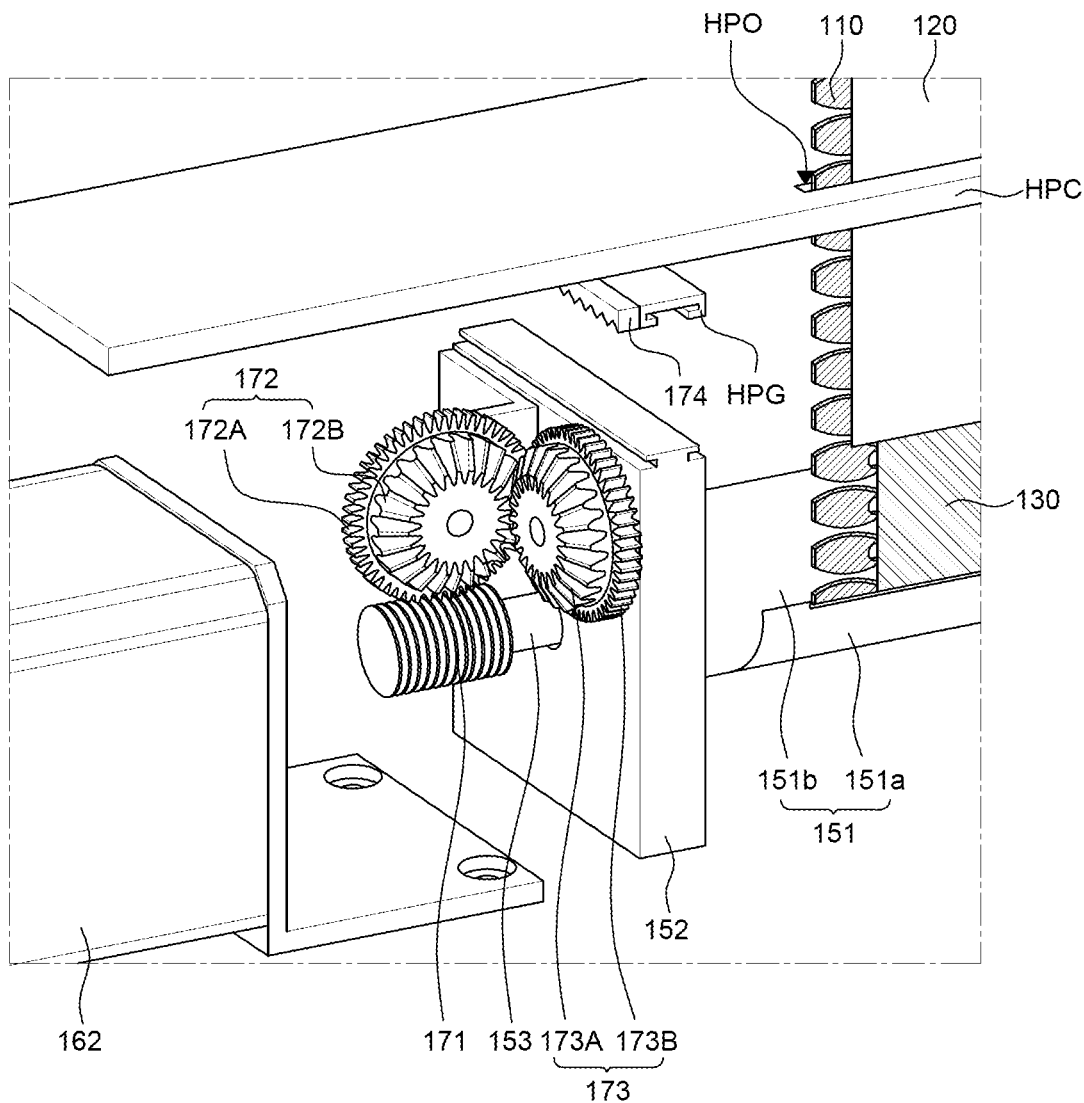
FIG. 6A is an exploded perspective view of a moving unit of the display device of FIG. 1A according to an embodiment of the present disclosure.
Figure 6B:
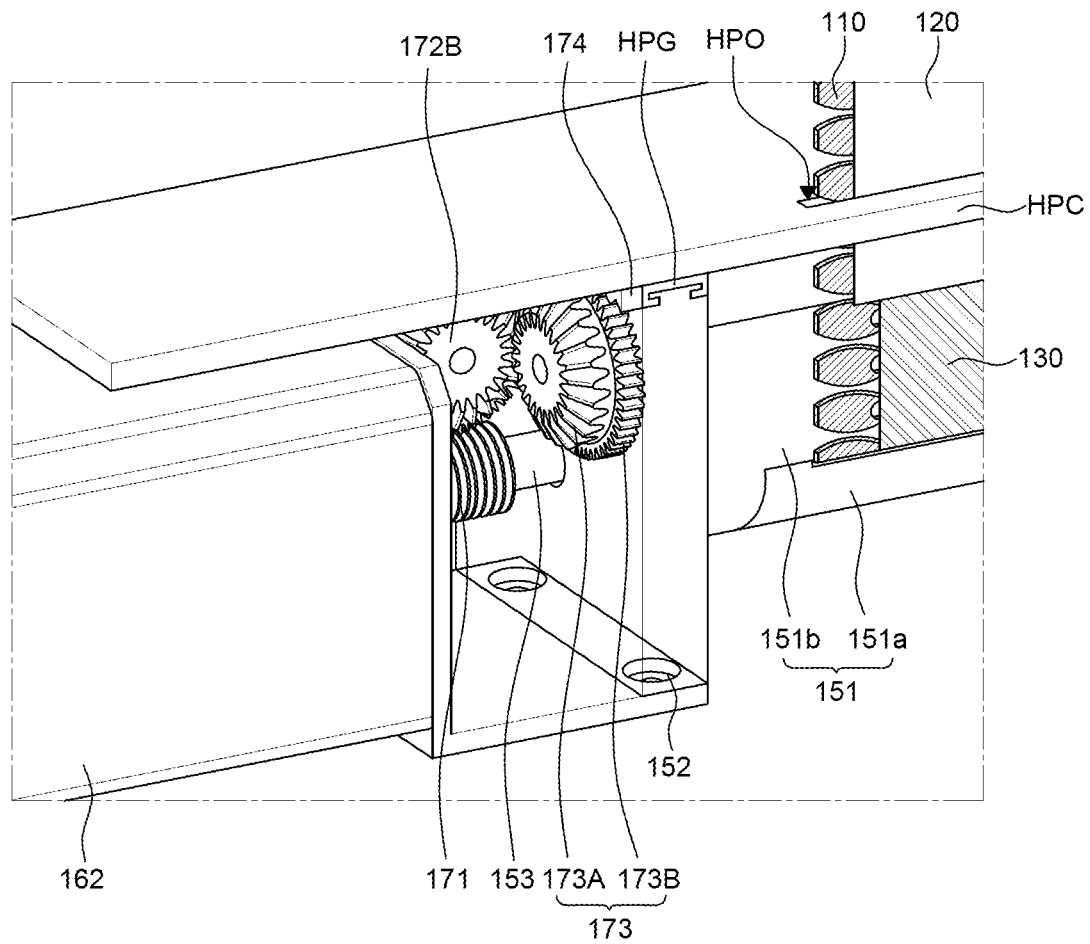
FIG. 6B is a perspective view of a coupling between the display part, a driving part and a housing of the display device of FIG. 1A according to an embodiment of the present disclosure.
Figure 7A:
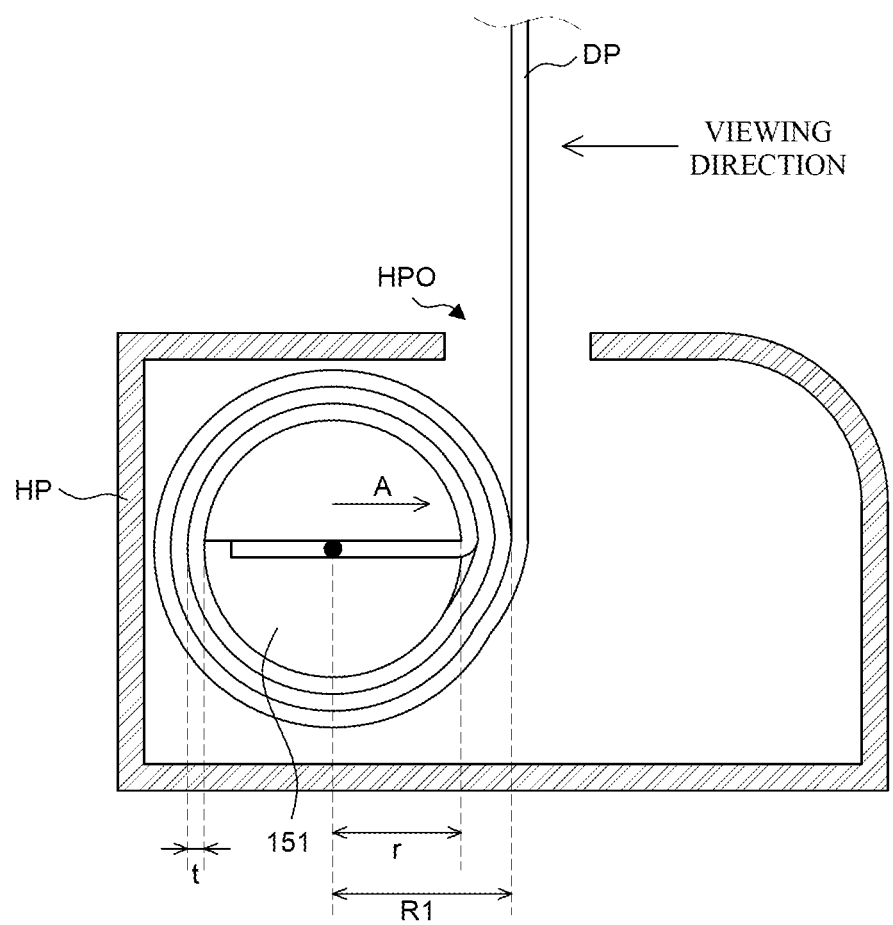
FIG. 7A and FIG. 7B are cross-sectional views schematically illustrating movement of a rotation shaft of a roller when the roller of the display device of FIG. 1A is wound or unwound about the roller according to an embodiment of the present disclosure.
Figure 7B:
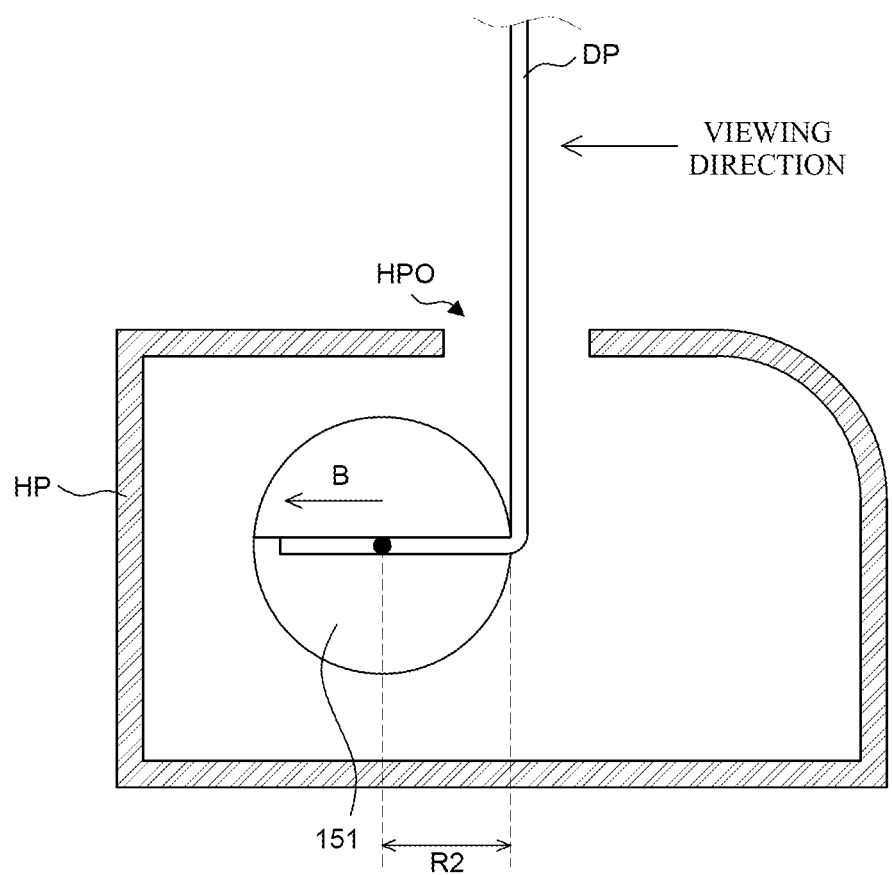

FIG. 6A is an exploded perspective view illustrating the moving unit 170 of the display device 100 according to an embodiment of the present disclosure. FIG. 6B is a perspective view illustrating a coupling of the display part, a driving part and a housing of the display device according to an embodiment of the present disclosure. FIG. 7A and FIG. 7B are cross-sectional views illustrating a movement of a rotation shaft of a roller when the roller is unwound. For the convenience of description, FIG. 7A and FIG. 7B illustrate only the housing part HP, the display part DP and the roller 151.

The moving unit 170 moves the roller 151 so as to correspond to a winding or unwinding amount of the display part DP. Specifically, when the display part DP is lifted in a vertical direction, the moving unit 170 may move the roller 151 in a horizontal direction.

Referring to FIG. 6A and FIG. 6B, the moving unit 170 includes a worm 171, a first gear 172, a second gear 173 and a third gear 174. Unless otherwise described below, each of the worm 171, the first gear 172, the second gear 173, and the third gear 174 include teeth, splines, ribs, threads, or other like structures on an outer peripheral surface that are mechanically connected to each other in the moving unit 170.

First, the worm 171 is disposed at the rotation shaft 153, which extends from the one end or the left end of the roller 151 The worm 171 may be disposed on the rotation shaft 153 in some embodiments and structured to rotate with the rotation shaft 153. Thus, the worm 171 may rotate with the rotation shaft 153 and the roller 151. That is, the worm 171 may rotate in the same direction as the rotary movement of the roller 151.

The worm 171 may be, for example, a screw shape with a plurality of screw threads, but is not limited thereto.

The first gear 172 rotates via rotation of the worm 171. Specifically, the first gear 172 includes a worm gear 172A having a plurality of saw teeth engaged with the threads of the worm 171. Thus, the first gear 172 is rotated in a direction perpendicular to a rotation direction of the worm 171 by the worm gear 172A.

Further, the first gear 172 includes a first sub-bevel gear 172B engaged with the second gear 173. The first sub-bevel gear 172B may operate as a bevel gear engaged with a second sub-bevel gear 173A of the second gear 173 to be described later.

The first gear 172 may be fixed to the roller support unit 152 by an additional fixing member connected to the roller support unit 152, but is not limited thereto. The first gear 172 may also be fixed directly to the housing part HP.

The second gear 173 rotates via rotation of the first gear 172 in a direction perpendicular to the rotation direction of the first gear 172. Specifically, the second gear 173 includes the second sub-bevel gear 173A engaged with the first sub-bevel gear 172B of the first gear 172. The second sub-bevel gear 173A may be disposed so as to be engaged with the first sub-bevel gear 172B. Thus, the second gear 173 may be rotated in a direction perpendicular to the rotation direction of the first gear 172 by the second sub-bevel gear 173A that rotates by the first sub-bevel gear 172B of the first gear 172.

The second gear 173 also includes a pinion gear 173B engaged with the third gear 174. The pinion gear 173B may operate as a rack pinion gear engaged with the third gear 174 to be described later.

The second gear 173 may be fixed to the roller support unit 152 by an additional fixing member connected to the roller support unit 152, but is not limited thereto.

The third gear 174 moves via rotation of the second gear 173 and changes a rotary movement of the second gear 173 to a linear movement that is being driven by the second gear 173. Specifically, the third gear 174 is a rack gear disposed on the ceiling or top surface HPC of the housing part HP. Thus, the pinion gear 173B of the second gear 173 is engaged with the third gear 174 so that the second gear 173 may have its rotational movement result in a linear movement of itself along a linear extension direction of the third gear 174. Therefore, the third gear 174 causes linear movement of the second gear 173, and the rotary movement of the second gear 173 is changed to a linear movement of itself, namely, of the second gear 173, as well as everything the second gear 173 is fixed to.

In this way, a rotary movement of the rotation shaft 153 by the motor 162 is changed to a linear movement of the second gear 173, the roller support unit 152 and everything fixed to the roller support unit 152, which includes the motor itself 162. Here, the second gear 173 is fixed to the roller support unit 152, and, thus, the linear movement of the second gear 173 is changed to a linear movement of the entire roller support unit 152. Also, the linear movement of the roller support unit 152 results in a linear movement of the roller 151. Therefore, the rotary movement by the motor 162 causes both linear movement of the roller 151 and also rotation of the roller 151. The rotation of the roller 151 to roll and unroll the display DP, is matched to also cause linear movement of the roller 151. Thus, as the overall Radius R1 (see FIG. 7A) changes as the display unrolls, the position of the display part DP relative to the opening HPO remains the same. Here, the direction of linear movement of the roller 151 may be a horizontal direction, which may be toward or away from a front or rear surface of the housing part HP, but the position of the display part DP remains fixed relative to the opening HPO in the housing part HP.

In some embodiments, the third gear 174 does not move, but rather, is fixed to the ceiling or top surface HPC of the housing part HP. As a result, rotation of the second gear 173 results in linear movement of the entire assembly or the entire driving part MP coupled to the roller support unit 150, namely the entire assembly of motor 162, worm 171 first gear 172, second gear 173, shaft 153, and roller support unit 152 along a linear path defined by the third gear 174. The second gear 173 is fixed to the roller support unit 152, which is structured to move linearly in response to the linear movement of the second gear 173. As a result, the movement of the second gear 173 results in linear movement of the roller 151 in the housing part HP in a horizontal direction to keep the display part DP centered in the opening HPO in the housing HP as the display rolls and unrolls.

Referring to FIG. 6A and FIG. 6B, a guide unit HPG (which may also be referred to herein as a guide HPG) is extended in the direction of linear movement of the second gear 173 so as to guide the linear movement of the roller support unit 152. To this end, the guide unit HPG may be disposed at an inner surface of the housing part HP.

The guide unit HPG may be coupled with the roller support unit 152 so that the roller support unit 152 may move linearly. For example, the guide unit HPG may include both side walls disposed in parallel with each other and two protrusions protruding from the both side walls in a track and channel arrangement. The roller support unit 152 may be inserted into a space formed by the guide unit HPG and may move linearly along the shape of the guide unit HPG. That is, the guide unit HPG and the roller support unit 152 together form a rail structure, and, thus, the roller support unit 152 may move linearly along the shape of the guide unit HPG. Here, referring to FIG. 6A and FIG. 6B, a cross-sectional shape of the guide unit HPG is illustrated as a "⊏" shape. However, the cross-sectional shape of the guide unit HPG may also be a taper shape or a reverse taper shape, and is therefore not limited to the shape shown in FIG. 6A and FIG. 6B.

The guide unit HPG may be disposed at the ceiling or top surface HPC of the housing part HP as well as at the bottom surface HPC of the housing part HP, or another selected surface of the housing part HP. In some embodiments where the guide unit HPG is located at the ceiling or top surface HPC of the housing part HP, assembly of the display device 100 may be more efficient. For example, the roller 151 may be connected to the ceiling or top surface HPC where the opening HPO of the housing part HP is disposed. Thus, the opening HPO of the housing part HP through which the display part DP may move in and out of the housing part HP and the roller 151 that winds or unwinds the display part may be disposed at accurate positions. Therefore, if the guide unit HPG fastened with the roller support unit 152 that supports the roller 151 is disposed at the ceiling surface HPC, it may be easier to fasten the roller support unit 152 with the guide unit HPG. Accordingly, it may be easier to assemble the display device 100.

Here, the moving unit 170 moves the roller 151 in an amount corresponding to a winding amount or an unwinding amount of the display part DP. To this end, when the rotation shaft 153 completes one full rotation, the first sub-bevel gear 172B and the second sub-bevel gear 173A may rotate by one pitch. Further, a gear ratio between the pinion gear 173B and the rack gear may be 1:1, and one pitch of the first sub-bevel gear 172B and the second sub-bevel gear 173A may correspond to the thickness of the display part DP. However, the present disclosure is not limited thereto. The pitch size of the first sub-bevel gear 172B and the second sub-bevel gear 173A, the gear ratio between the pinion gear 173B and the rack gear and the like may be selected depending on design factors.

More specifically, referring to FIG. 7A and FIG. 7B, the display part DP may be wound three times on the roller 151 as shown in FIG. 7A. Here, when the roller 151 and the display part DP are viewed as a cylindrical object, a radius R1 of the corresponding object may be defined as r+3t which is the sum of a radius r of the roller 151 and three times a thickness t of the display part DP. Herein, the thickness t of the display part DP may be defined by a cross-sectional thickness of a portion of the display part DP where the display panel 120 is located. That is, the thickness t of the display part DP may be defined by a cross-sectional thickness of the display part DP wound on the roller 151. Then, if the display part DP is unwound as shown in FIG. 7B, a radius R2 of the object may be equal to the radius r of the roller 151. That is, the radius R1 of the object may decrease by 3t during unwinding of the display part DP. Thus, the moving unit 170 may move the roller 151 by 3t in a direction toward the opening HPO in the housing part HP as indicated by an arrow A, i.e., to the right in FIG. 7A and FIG. 7B.

In contrast, if the display part DP is wound from the state shown in FIG. 7B to the state shown in FIG. 7A, the moving unit 170 may move the roller 151 by 3t in a direction away from the opening as indicated by an arrow B, i.e., to the left in FIG. 7A and FIG. 7B. Thus, the moving unit 170 moves the roller 151 in order to consistently position the display part DP proximate, or at, a center of the opening HPO through the housing part HP, which has a number of benefits. For example, damage is less likely to occur by contact of the display part DP with the housing part HP. Further, the display part DP can be unwound from the roller 151 in a vertical direction to improve the viewing experience for the viewer, among other benefits and advantages.

In a conventional rollable display device, as the display is wound on a roller, the radius of the cylindrical object formed by the roller and the display increases by the thickness of the display part. As described above, as the radius of the object increases, a lower end of the display part may extend in a horizontal direction due to the position of the object. Accordingly, when the user watches the display part, the lower end of the display part protrudes in a direction toward or opposite to the position of the user and display may not be flat. On the contrary, as the display part is unwound from the roller, the radius of the cylindrical object formed by the roller and the display part decreases by the thickness of the display part. As described above, as the radius of the object decreases, the lower end of the display part disposed in the vertical direction is pulled in the horizontal direction. Accordingly, when the user watches the display part, the lower end of the display part is pulled in the direction toward or opposite to the position of the user. Therefore, the display part may not be flat.

To solve the above-described problem in conventional displays, an auxiliary roller configured to apply predetermined elastic force to the display part has been used. In order to suppress a movement of the lower end of the display part in the direction toward or opposite to the position of the user, the auxiliary roller may apply elastic force to the display part so that the display DP may be seen as always being flat by the user. However, if the auxiliary roller is used, the auxiliary roller may scratch the surface of the display and cause damage to the display. Also, the auxiliary roller may shield the display area of the display panel.

In the display device 100 according to embodiments of the present disclosure, during winding or unwinding of the roller 151, the moving unit 170 moves the roller 151 in the horizontal direction. Thus, the unwound display part DP may maintain a flat state outside the housing part HP that is generally arranged vertically, without any horizontal distortion. Specifically, when the display part DP is wound on or unwound from the roller 151, the moving unit 170 may move the display part DP in the horizontal direction in an amount based on the thickness of the display panel 120 wound on or unwound from the roller 151. Accordingly, in the display device 100 according to embodiments of the present disclosure, the display part DP may be seen as always being flat by the user. Also, the display part DP may maintain a flat state without using an auxiliary roller. Therefore, it is possible to suppress shielding of the display area or to minimize damage to the surface of the display panel 120 that may occur when an auxiliary roller is used.

Figure 8:
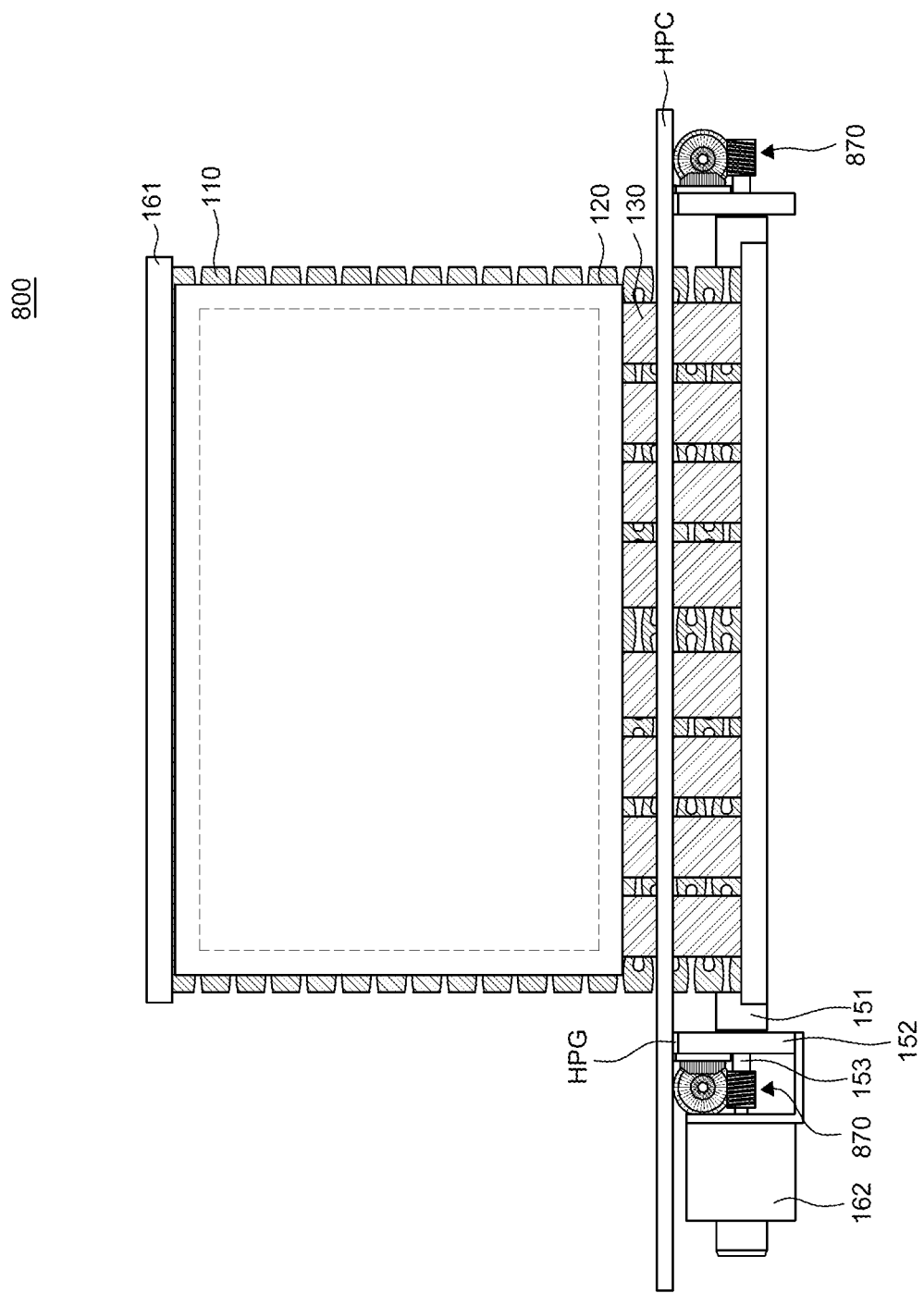
FIG. 8 is an elevational view of a display device according to another embodiment of the present disclosure.

FIG. 8 is a plan view of a display device 800 according to another embodiment of the present disclosure. The display device 800 shown in FIG. 8 may have substantially the same configuration as the display device 100 shown in FIG. 1 through FIG. 7B except moving units 870. Thus, a repeated description will be omitted.

Referring to FIG. 8, in the display device 800 according to another embodiment of the present disclosure, the moving units 870 are disposed at both ends of the roller 151. That is, a worm, a first gear, a second gear and a third gear are disposed at each of one or a first end of the roller 151 adjacent to the motor 162 and the other or a second end of the roller 151 on the opposite side of the roller 151, respectively. Thus, the moving units 870 may be symmetrically disposed at the both ends of the roller 151. In some embodiments, the moving units 870 may be referred to herein as a first roller gear assembly and a second roller gear assembly disposed at opposite ends of the roller 151 to provide an equal amount of movement of the roller 151 at both ends. This arrangement may be particularly advantageous for larger displays with a larger roller 151, although a single moving unit 870 may be used in different sizes of displays in some embodiments.

Accordingly, as described above, a rotary movement of the rotation shaft 153 by the motor 162 is changed by the worms, the first gears, the second gears and the third gears disposed at the both ends of the roller 151 to a linear movement of the second gears. Also, the linear movement of the second gears is changed to a linear movement of the roller support unit 152, and the linear movement of the roller support unit 152 is changed to a linear movement of the roller 151. Therefore, the rotary movement by the motor 162 is finally changed to the linear movement of the roller 151 and of itself. Here, the direction of linear movement of the roller 151 may be a horizontal direction. Thus, the gears 172, 173 and 174 are connected to each other in way that rotation of the motor 162 causes linear movement of the motor 162, as it rotates. The linear movement of motor 162 will correspond to and result from its own rotational movement.

Thus, in the display device 800 according to another embodiment of the present disclosure, the moving units 870 are symmetrically disposed at the both ends of the roller 151. Therefore, it is possible to maintain a flat state of the unwound display part DP outside the housing part HP while more stably moving the roller 151 in the horizontal direction. Specifically, when the display part DP is wound on or unwound from the roller 151, the moving units 870 may move the display part DP in the horizontal direction based on the thickness of the display panel 120 wound on or unwound from the roller 151. Here, the moving units 870 are symmetrically disposed at the both ends of the roller 151 and thus may horizontally move the roller 151 in a symmetrical manner at the both ends of the roller 151. Thus, the moving units 870 may horizontally move the roller 151 more stably. Accordingly, in the display device 800 according to another embodiment of the present disclosure, the display part DP may be seen as always being flat by the user. Also, the display part DP may maintain a flat state without using an auxiliary roller. Therefore, it is possible to suppress shielding of the display area or damage to the surface of the display panel 120 that may occur when an auxiliary roller is used.

Figure 9:
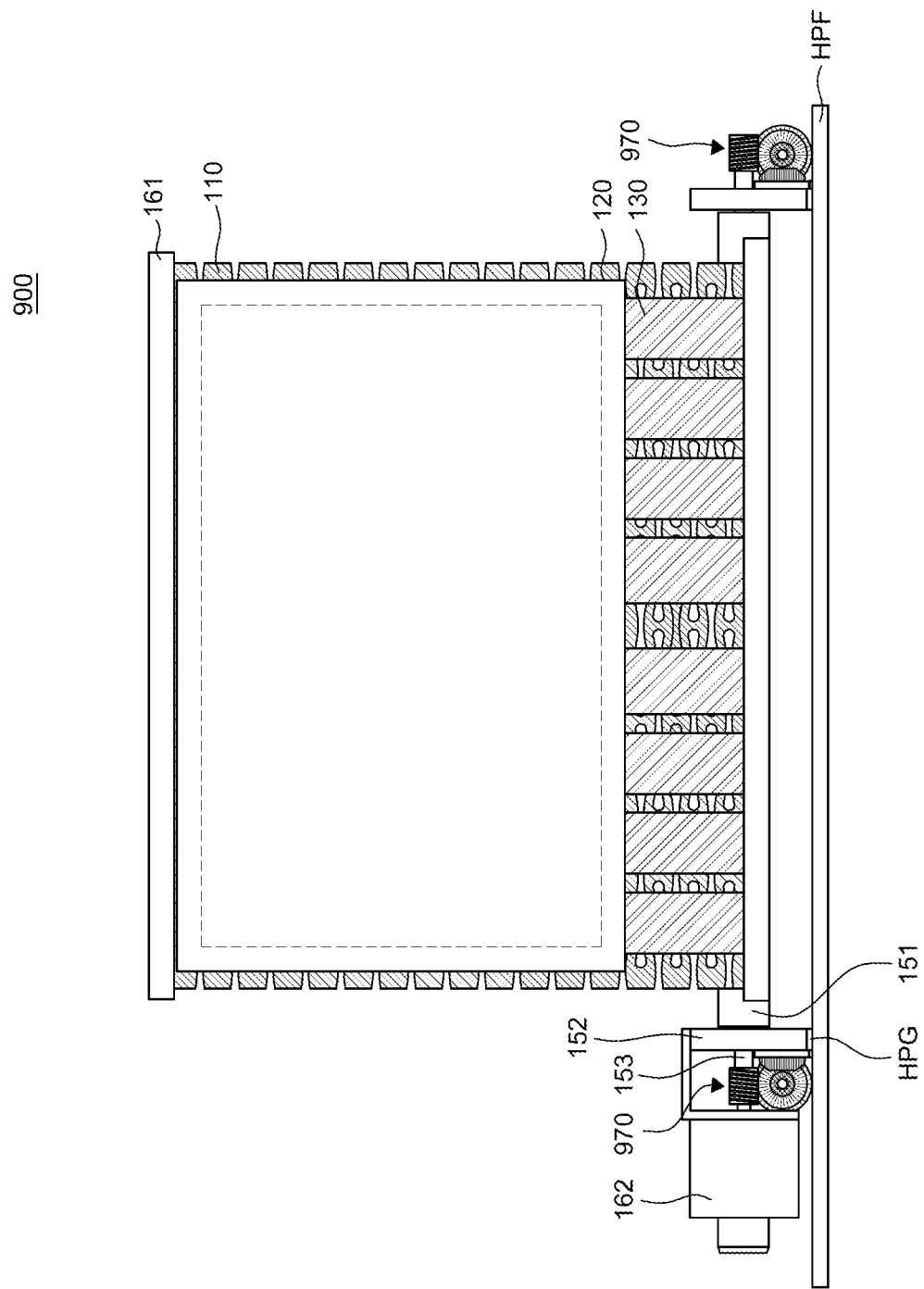
FIG. 9 is an elevational view of a display device according to yet another embodiment of the present disclosure.

FIG. 9 is a plan view of a display device 900 according to yet another embodiment of the present disclosure. The display device 900 shown in FIG. 9 may have substantially the same configuration as the display device 800 shown in FIG. 8 except moving units 970. Thus, a repeated description will be omitted.

Referring to FIG. 9, the guide unit HPG and the third gear 174 are disposed at a bottom surface HPF of the housing part HP. Thus, the roller support unit 152 coupled with the guide unit HPG may be connected to and disposed at the bottom surface HPF among the inner surfaces of the housing part HP.

In the display device 900 according to yet another embodiment of the present disclosure, the roller support unit 152 may be connected to and disposed at the bottom surface HPF of the housing part HP. Thus, the roller support unit 152 may move linearly on the bottom surface HPF of the housing part HP where the guide unit HPG is disposed. Specifically, the guide unit HPG and the third gear 174 are disposed at the bottom surface HPF of the housing part HP, and the guide unit HPG is extended in the direction of linear movement of the second gear 173 connected to the third gear 174. Also, the guide unit HPG may be coupled with the roller support unit 152 so that the roller support unit 152 may move linearly. For example, the roller support unit 152 may be inserted into a space formed by the guide unit HPG disposed at the bottom surface HPF of the housing part HP. Also, the guide unit HPG and the roller support unit 152 together form a rail structure, and, thus, the roller support unit 152 may move linearly along the shape of the guide unit HPG. Therefore, in the display device 900 according to yet another embodiment of the present disclosure, the roller support unit 152 may be may be connected to and disposed at the bottom surface HPF among the inner surfaces of the housing part HP. Also, the roller support unit 152 may move linearly on the bottom surface HPF of the housing part HP where the guide unit HPG is disposed. Thus, the roller 151 supported by the roller support unit 152 may also move linearly.

The embodiments of the present disclosure can also be described as follows.

According to an embodiment of the present disclosure, a display device includes: a display part including a display panel and a back cover configured to support a rear surface of the display panel; a roller configured to wind or unwind the display part; a moving unit configured to move the roller so as to correspond to a winding or unwinding amount of the display part; and a housing part configured to accommodate the roller and the moving unit and having an opening so that the display part moves to an outside.

The moving unit may move the roller in a horizontal direction.

The moving unit may move the roller in a direction away from the opening when the display part is wound and may move the roller in a direction close to the opening when the display part is unwound.

The moving unit may include: a worm disposed at a rotation shaft extended from one end of the roller; a first gear configured to rotate by a rotation of the worm; a second gear configured to rotate in a direction perpendicular to a rotation direction of the first gear by a rotation of the first gear; a third gear configured to move by a rotation of the second gear, changes a rotary movement of the second gear to a linear movement of the second gear and is disposed on an inner surface of the housing part. The roller may move linearly as the second gear moves linearly along with the third gear.

The first gear may include a worm gear engaged with the worm and a first sub-bevel gear engaged with the second gear. The second gear may include a second sub-bevel gear engaged with the first sub-bevel gear and a pinion gear engaged with the third gear. The third gear may be a rack gear.

While the rotation shaft rotates once, the first sub-bevel gear and the second sub-bevel gear may rotate by one pitch. A gear ratio between the pinion gear and the rack gear may be 1:1. One pitch of the first sub-bevel gear and the second sub-bevel gear may correspond to the thickness of the display part.

The display device may further include: a motor disposed at the one end of the roller and connected to the rotation shaft and supplies a driving force for rotating the roller.

The worm, the first gear, the second gear and the third gear may be further disposed at the other end of the roller.

The display device may further include: a roller support unit configured to support the roller; and a guide unit disposed on the inner surface of the housing part and extended in a direction of linear movement of the second gear to guide a linear movement of the roller support unit.

The guide unit and the third gear may be disposed on a bottom surface or a ceiling surface among the inner surfaces of the housing part.

The guide unit and the roller support unit may be disposed at each of both ends of the roller.

A total length of movement of the roller by the moving unit may be equal to a length of a sum of a thickness of the display part fully wound on the roller.

According to an embodiment of the present disclosure, a display device includes: a display panel; a roller coupled to the display panel; a drive assembly coupled to the roller, the drive assembly configured to rotate the roller to wind or unwind the display panel; a roller gear assembly coupled to the roller; and a housing having an opening through which the display panel moves in response to rotation of the roller with the roller, the drive assembly, and the roller gear assembly received in the housing and the roller gear assembly configured to convert rotational motion of the roller to linear motion of the roller relative to the opening in the housing.

The roller gear assembly may be further configured to move the roller in a horizontal direction in response to movement of the display panel in a vertical direction.

The roller gear assembly may further include: a rotation shaft coupled to a first end of the roller; a worm disposed on the rotation shaft; a first gear configured to rotate in response to rotation of the worm; a second gear configured to rotate in response to rotation of the first gear; and a third gear coupled to an inner surface of the housing, the second gear configured to move linearly relative to the third gear to convert rotational motion of the roller to linear motion of the roller.

The display device may further include: a guide disposed on an inner surface of the housing, the guide extending in a direction of linear movement of the second gear to guide the linear motion of the roller.

In an embodiment according to the present disclosure, a display device includes: a display panel; a roller coupled to the display panel, the roller configured to wind or unwind the display panel; a roller gear assembly coupled to the roller, the roller gear assembly configured to move the roller in a linear direction in an amount corresponding to a rotational movement of the roller; and a housing having an opening through which the display panel moves in response to rotation of the roller.

The roller gear assembly may be a first roller gear assembly disposed at a first end of the roller, the display device further including a second roller gear assembly disposed at a second end of the roller, the second roller gear assembly configured to move the roller in the linear direction in response to rotational movement of the roller.

The roller gear assembly may be further configured to convert rotational motion of the roller to linear motion of the roller relative to the opening in the housing to maintain the display panel proximate a center of opening.

The roller gear assembly may also include a rack and a pinion coupled to the rack and to the roller, the roller and the roller gear assembly configured to rotate the pinion to move the pinion in the linear direction along the rack to move the roller in the linear direction in the amount corresponding to the rotational movement of the roller.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. A display device, comprising:
a display assembly including a display panel and a back cover configured to support a rear surface of the display panel;
a roller configured to wind or unwind the display assembly;
a roller gear assembly configured to move the roller in an amount corresponding to a winding amount or an unwinding amount of the display assembly about the roller; and
a housing configured to accommodate the display assembly, the roller and the roller gear assembly, the housing having an opening through which the display assembly moves in and out of the housing in response to rotation of the roller,
wherein the roller gear assembly includes:
a worm disposed at a rotation shaft extending from a first end of the roller;
a first gear configured to rotate in response to rotation of the worm;
a second gear configured to rotate in a direction perpendicular to a rotation direction of the first gear in response to rotation of the first gear; and
a third gear configured to convert a rotary movement of the second gear to a linear movement of the second gear, the third gear disposed on an inner surface of the housing, and
wherein the roller moves linearly in response to movement of the second gear.

2. The display device according to claim 1, wherein the roller gear assembly is configured to move the roller in a horizontal direction.

3. The display device according to claim 2, wherein the roller gear assembly is configured to move the roller in a direction away from the opening of the housing during winding of the display assembly around the roller, the roller gear assembly is further configured to move the roller in a direction toward the opening of the housing during unwinding of the display assembly from the roller.

4. The display device according to claim 1, wherein the first gear includes a worm gear engaged with the worm and a first sub-bevel gear engaged with the second gear,
wherein the second gear includes a second sub-bevel gear engaged with the first sub-bevel gear and a pinion gear engaged with the third gear, and
wherein the third gear is a rack gear.

5. The display device according to claim 4, wherein one rotation of the rotation shaft results in rotation of the first sub-bevel gear and the second sub-bevel gear by one pitch, and
wherein a gear ratio between the pinion gear and the rack gear is 1:1, and
wherein one pitch of the first sub-bevel gear and one pitch of the second sub-bevel gear correspond to the thickness of the display assembly.

6. The display device according to claim 1, further comprising: a motor disposed at the first end of the roller and coupled to the rotation shaft, the motor configured to supply a driving force for rotating the roller.

7. The display device according to claim 1, wherein the roller gear assembly is disposed at one end or two ends of the roller.

8. The display device according to claim 1, further comprising: a roller support configured to support the roller; and a guide disposed on an inner surface of the housing, the guide extending in a direction of linear movement of the second gear to guide a linear movement of the roller support.

9. The display device according to claim 8, wherein the guide and the third gear are disposed on a bottom surface or a top surface of the housing.

10. The display device according to claim 8, wherein the guide and the roller support are disposed at each of both ends of the roller.

11. The display device according to claim 1, wherein a total length of linear movement of the roller is equal to a sum of a thickness of the display assembly fully wound on the roller.

12. A display device, comprising:
a display panel;
a roller coupled to the display panel;
a roller support coupled to the roller;
a motor coupled to the roller and to the roller support, the motor configured to rotate the roller to wind or unwind the display panel;
a roller gear assembly coupled to the roller support; and
a housing having an opening through which the display panel moves in response to rotation of the roller,
wherein the roller gear assembly is configured to convert rotational motion of the roller to linear motion of the roller support and linear motion of the roller, the motor, and the roller gear assembly coupled to the roller support relative to the opening in the housing.

13. The display device of claim 12 wherein the roller gear assembly is configured to move the roller in a horizontal direction in response to movement of the display panel in a vertical direction.

14. The display device of claim 12 wherein the roller gear assembly includes:
a rotation shaft coupled to a first end of the roller;
a worm disposed on the rotation shaft;
a first gear configured to rotate in response to rotation of the worm;
a second gear configured to rotate in response to rotation of the first gear; and
a third gear coupled to an inner surface of the housing, the second gear configured to move linearly relative to the third gear to convert rotational motion of the roller to linear motion of the roller.

15. The display device according to claim 12, further comprising:
a guide disposed on an inner surface of the housing, the guide configured to guide the linear motion of the roller support and the roller, the guide including a channel engaging with a rail of the roller support.

16. A display device, comprising:
a display panel;
a roller coupled to the display panel, the roller configured to wind or unwind the display panel;
a roller support coupled to the roller and including a rail;
a roller gear assembly coupled to the roller support, the roller gear assembly configured to move the roller and the roller support in a linear direction in an amount corresponding to a rotational movement of the roller;
a housing having an opening through which the display panel moves in response to rotation of the roller; and
a guide coupled to the housing and including a channel engaging with the rail of the roller support to guide linear movement of the roller.

17. The display device according to claim 16 wherein the roller gear assembly is a first roller gear assembly disposed at a first end of the roller, the display device further comprising:
- a second roller gear assembly disposed at a second end of the roller, the second roller gear assembly configured to move the roller in the linear direction in response to rotational movement of the roller.

18. The display device according to claim 16 wherein the roller gear assembly is configured to convert rotational motion of the roller to linear motion of the roller relative to the opening in the housing to maintain the display panel proximate a center of opening.

19. The display device according to claim 16 wherein the roller gear assembly includes a rack and a pinion coupled to the rack and to the roller, the roller and the roller gear assembly configured to rotate the pinion to move the pinion in the linear direction along the rack to move the roller in the linear direction in the amount corresponding to the rotational movement of the roller.

\* \* \* \* \*